United States Patent
Kopp et al.

(10) Patent No.: US 9,151,893 B2
(45) Date of Patent: Oct. 6, 2015

(54) RADIATION-EMITTING SEMICONDUCTOR COMPONENT WITH A WAVEGUIDE MEETING A MIRROR SURFACE PERPENDICULARLY AND MEETING A COUPLING-OUT SURFACE OBLIQUELY

(75) Inventors: Fabian Kopp, Regensburg (DE); Alfred Lell, Maxhuette-Haidhof (DE); Christoph Eichler, Tegernheim (DE); Clemens Vierheilig, Tegernheim (DE); Soenke Tautz, Tegernheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/239,935

(22) PCT Filed: Jul. 30, 2012

(86) PCT No.: PCT/EP2012/064894
§ 371 (c)(1),
(2), (4) Date: Apr. 15, 2014

(87) PCT Pub. No.: WO2013/026655
PCT Pub. Date: Feb. 28, 2013

(65) Prior Publication Data
US 2014/0217425 A1    Aug. 7, 2014

(30) Foreign Application Priority Data
Aug. 25, 2011 (DE) .......................... 10 2011 111 604

(51) Int. Cl.
G02B 6/125 (2006.01)
H01L 33/00 (2010.01)
(Continued)

(52) U.S. Cl.
CPC ............ G02B 6/125 (2013.01); H01L 33/0045 (2013.01); H01S 5/0264 (2013.01); H01S 5/1017 (2013.01); H01S 5/1085 (2013.01); H01S 2301/166 (2013.01)

(58) Field of Classification Search
CPC ....................................................... G02B 6/125
See application file for complete search history.

(56) References Cited

U.S. PATENT DOCUMENTS

| 5,349,602 | A |   | 9/1994 | Mehuys et al. |
| 5,463,705 | A | * | 10/1995 | Clauberg et al. ................ 385/14 |

(Continued)

FOREIGN PATENT DOCUMENTS

| DE | 102008058436 A1 | 5/2010 |
| DE | 102008061152 A1 | 6/2010 |

(Continued)

OTHER PUBLICATIONS

Feltin, E., et al., "Broadband blue superluminescent light-emitting diodes based on GaN," Applied Physics Letters, vol. 95, Aug. 26, 2009, pp. 081107-1-081107-3.

(Continued)

Primary Examiner — Ida M Soward
(74) Attorney, Agent, or Firm — Slater & Matsil, L.L.P.

(57) ABSTRACT

A radiation-emitting semiconductor component includes a semiconductor body. The semiconductor body has a semiconductor layer sequence having an active region provided for generating radiation. The semiconductor component has a waveguide, which is provided for laterally guiding the radiation generated in the active region and which extends between a mirror surface and a coupling-out surface. The waveguide meets the mirror surface perpendicularly and forms an acute angle with a normal to the coupling-out surface.

18 Claims, 13 Drawing Sheets

(51) Int. Cl.
*H01S 5/026* (2006.01)
*H01S 5/10* (2006.01)

(56) References Cited

U.S. PATENT DOCUMENTS

| | | | |
|---|---|---|---|
| 5,539,571 A * | 7/1996 | Welch et al. | 359/344 |
| 5,610,760 A * | 3/1997 | Drenten et al. | 359/332 |
| 6,882,672 B2 * | 4/2005 | Marutani et al. | 372/45.01 |
| 7,483,140 B1 * | 1/2009 | Cho et al. | 356/445 |
| 7,885,305 B2 * | 2/2011 | Watanabe et al. | 372/45.01 |
| 8,526,771 B2 * | 9/2013 | Meyer et al. | 385/31 |
| 8,857,242 B2 * | 10/2014 | Heidrich et al. | 73/24.02 |
| 2001/0041027 A1 * | 11/2001 | Hornbeck et al. | 385/47 |
| 2002/0018507 A1 * | 2/2002 | Deacon | 372/96 |
| 2003/0219053 A1 | 11/2003 | Swint et al. | |
| 2004/0179801 A1 * | 9/2004 | Montgomery et al. | 385/129 |
| 2005/0161685 A1 | 7/2005 | Velez et al. | |
| 2006/0088256 A1 * | 4/2006 | Dangelmaier et al. | 385/92 |
| 2006/0110094 A1 * | 5/2006 | Bachl et al. | 385/14 |
| 2006/0233210 A1 * | 10/2006 | Takayama | 372/43.01 |
| 2007/0014505 A1 * | 1/2007 | Hosomi et al. | 385/12 |
| 2010/0238962 A1 | 9/2010 | Oh et al. | |
| 2010/0322278 A1 | 12/2010 | Mochizuki | |
| 2011/0033150 A1 * | 2/2011 | Tan et al. | 385/14 |
| 2011/0164875 A1 * | 7/2011 | Bicknell et al. | 398/43 |
| 2012/0039576 A1 * | 2/2012 | Dangel et al. | 385/123 |
| 2012/0163752 A1 * | 6/2012 | Kim et al. | 385/14 |

FOREIGN PATENT DOCUMENTS

| | | |
|---|---|---|
| EP | 0468482 A2 | 1/1992 |
| JP | 2213180 | 8/1990 |
| JP | 2003142777 A | 5/2003 |
| JP | 2010192603 A | 9/2010 |
| JP | 2011155103 A | 8/2011 |
| WO | 03088367 A2 | 10/2003 |
| WO | 2004005985 A1 | 1/2004 |

OTHER PUBLICATIONS

Holc, K., et al., "Temperature dependence of superluminescence in InGaN-based superluminescent light emitting diode structures," Journal of Applied Physics, vol. 108, Jul. 14, 2010, pp. 013110-1-013110-4.

Lin C. F., "Superluminescent Diodes with Angled Facet Etched by Chemically Assisted Ion Beam Etching," Electronics Letters, vol. 27, No. 11, May 23, 1991, pp. 968-970.

Mundbrod, M., "Ridge-Waveguide Lasers with Tilted Facets," Annual Report 2003, Optoelectronics Department, University of Ulm, pp. 1-6.

Raring, J. W., et al., "47.1: Invited Paper: Progress in Green and Blue Laser Diodes and Their Application in Pico Projection Systems," SID Symposium Digest of Technical Papers, vol. 42, Issue 1, Jun. 2011, pp. 677-680.

Semenov A. T., et al., "Wide Spectrum Single Quantum Well Superluminescent Diodes at 0.8 MUM With Bent Optical Waveguide," Electronics Letters, vol. 29, No. 10, May 13, 1993, pp. 854-856.

\* cited by examiner

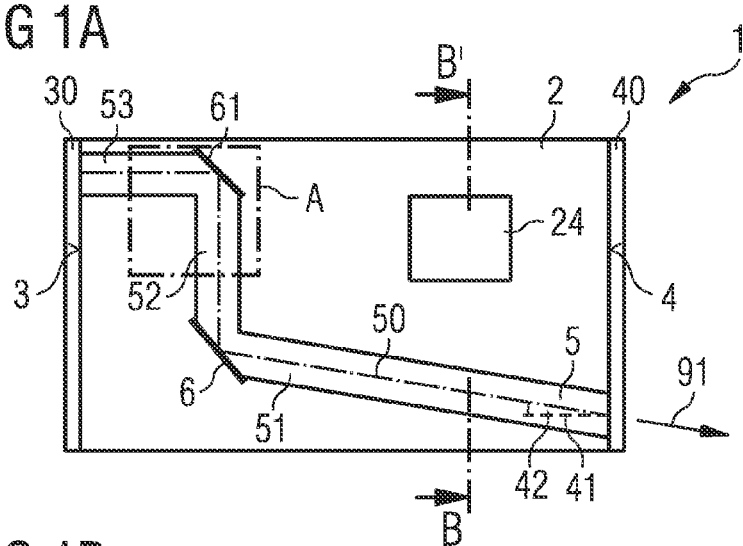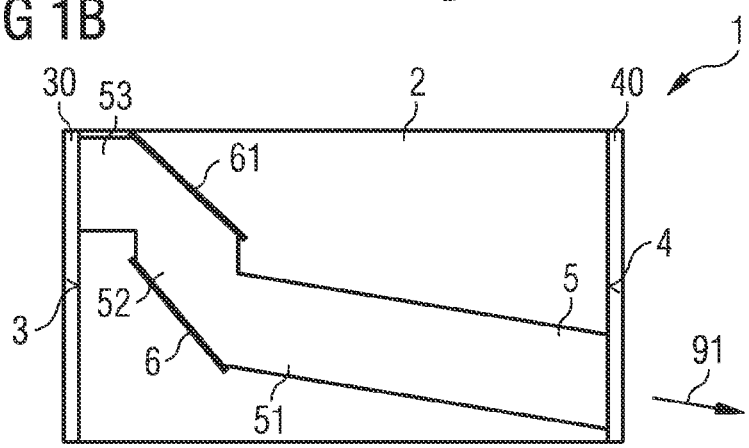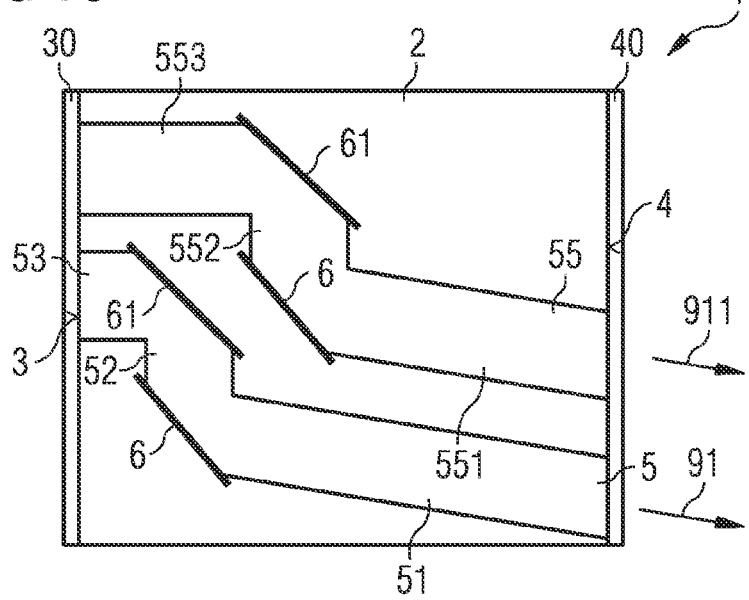

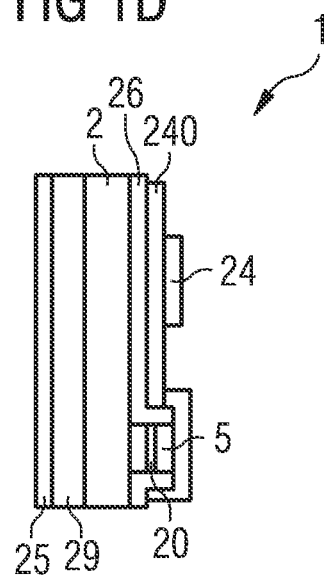
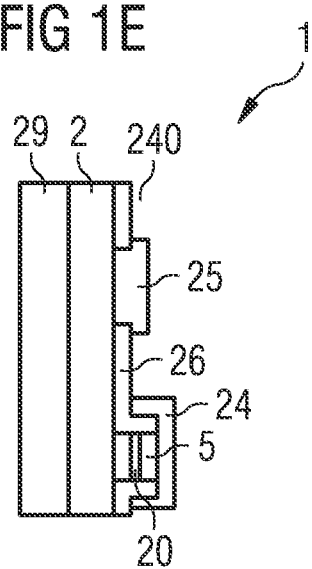

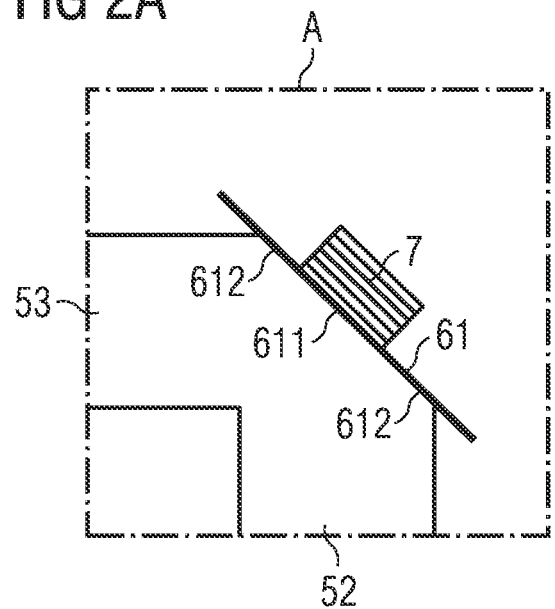
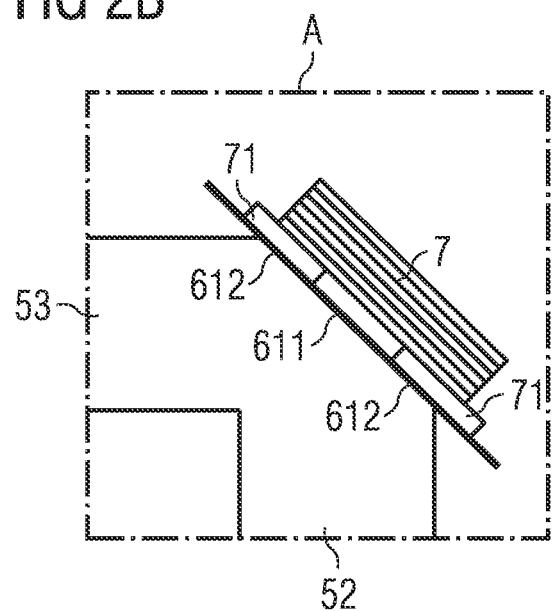

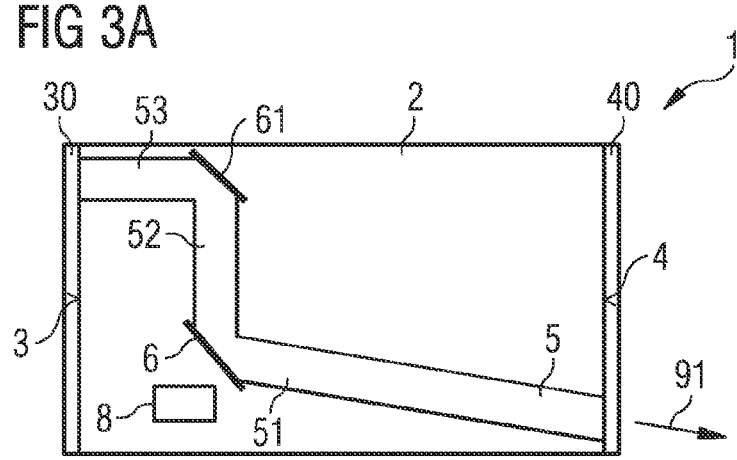
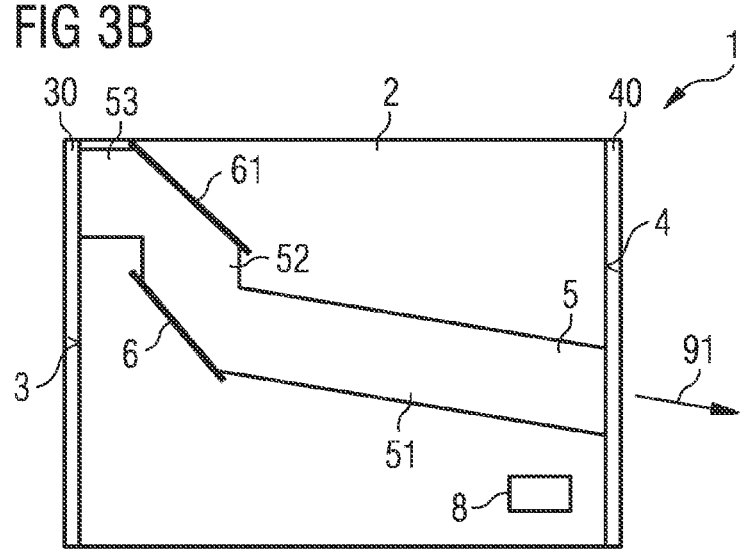
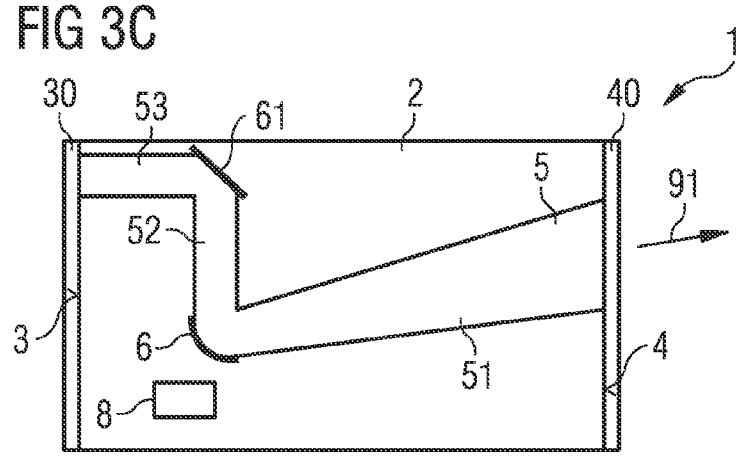

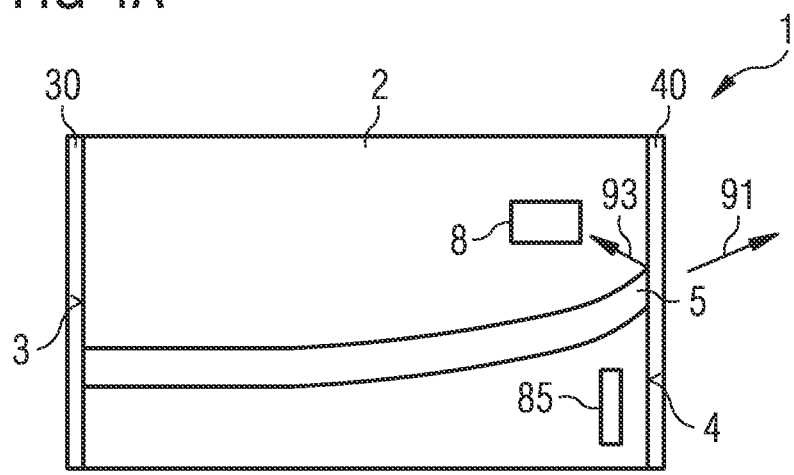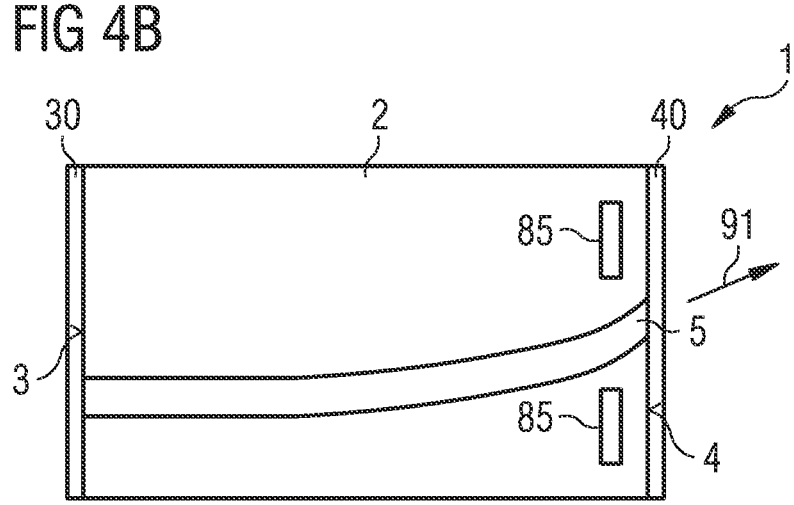

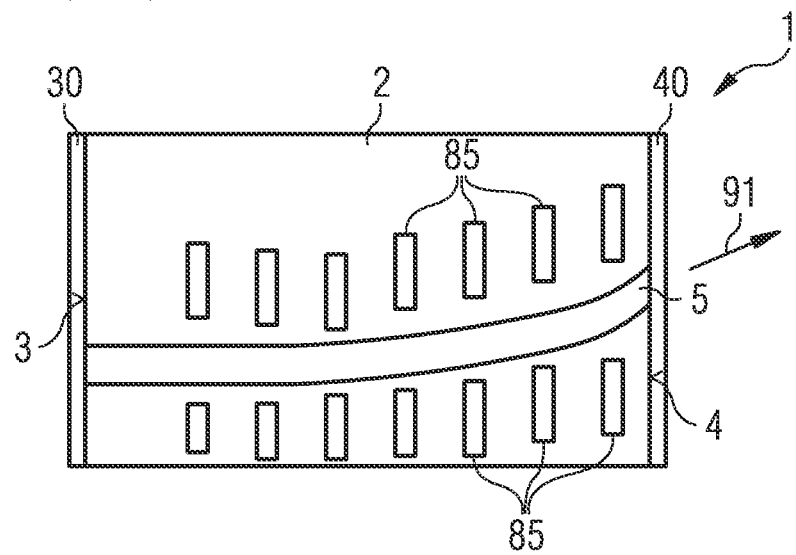
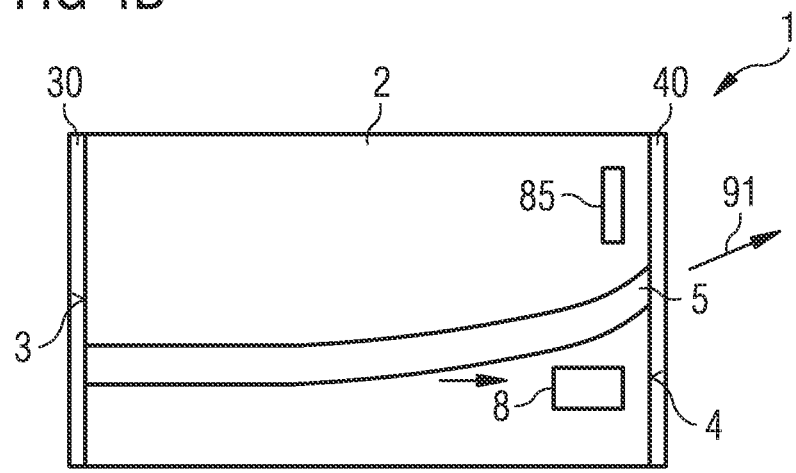

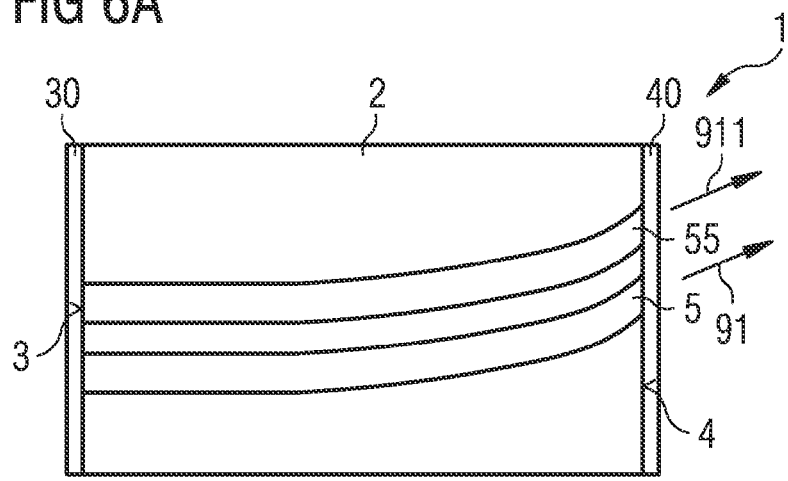
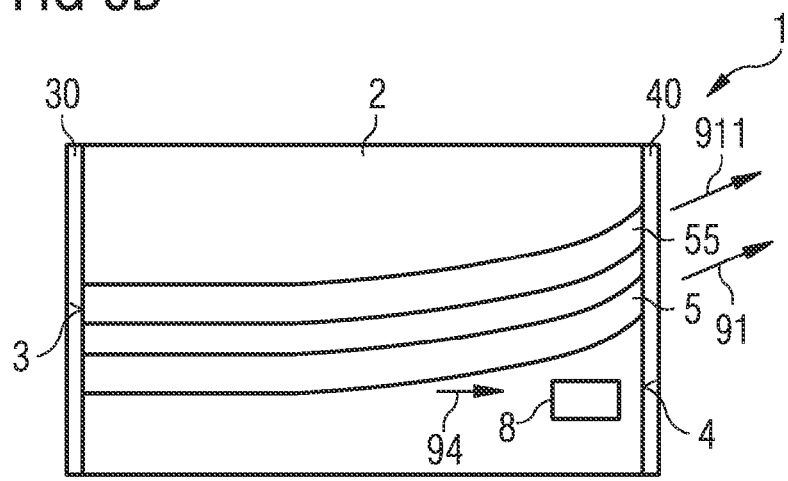
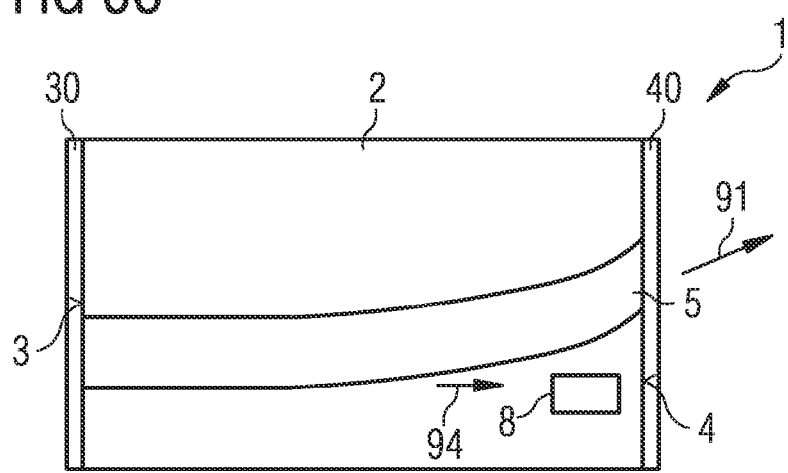

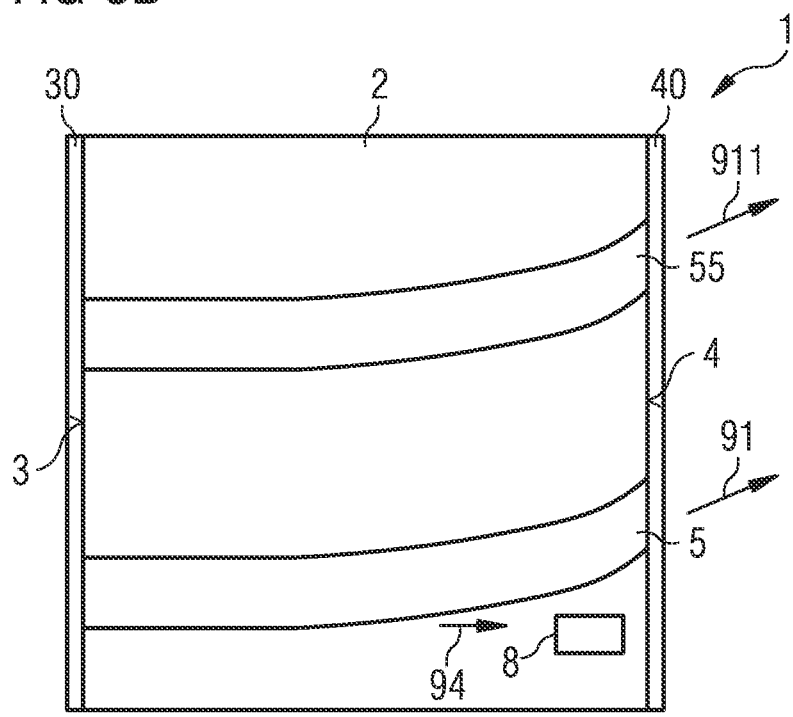

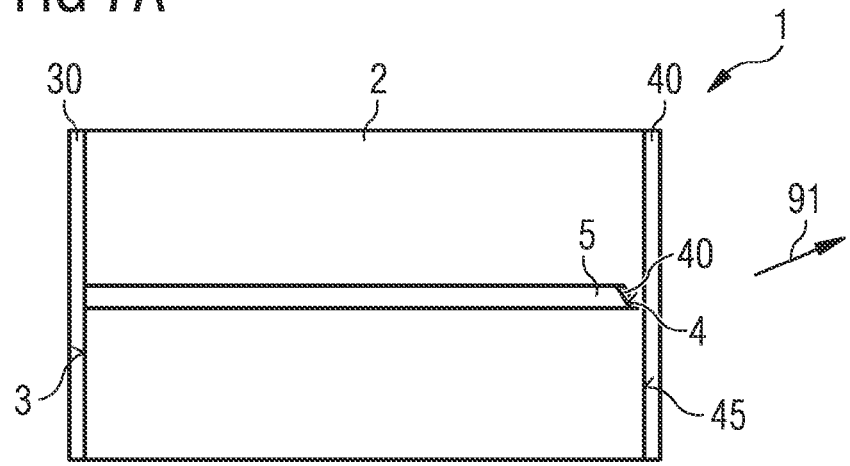
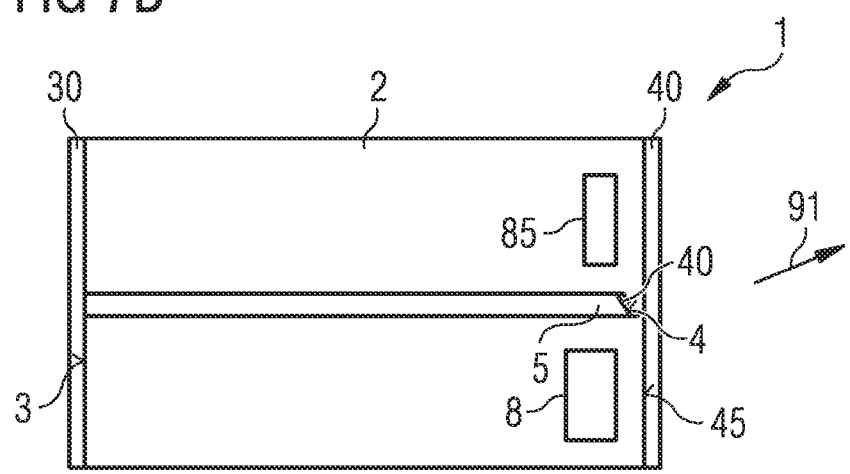
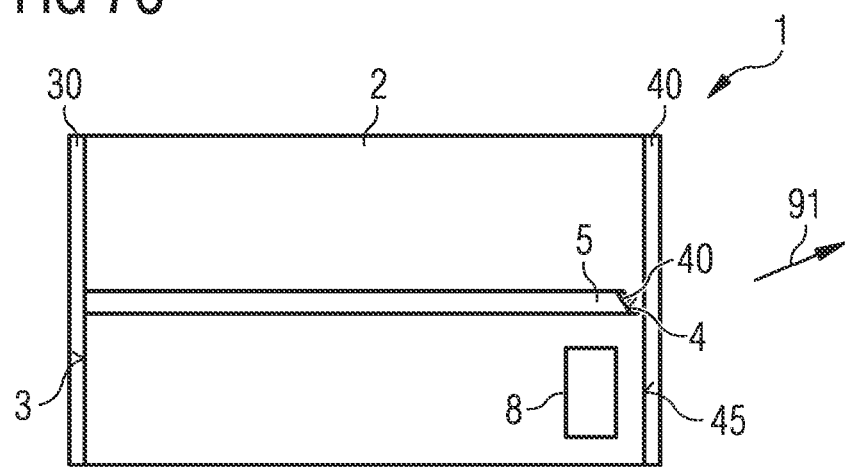

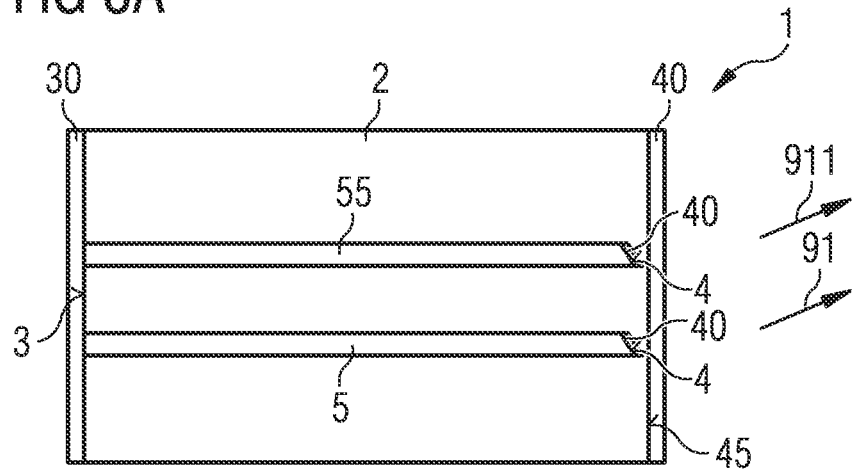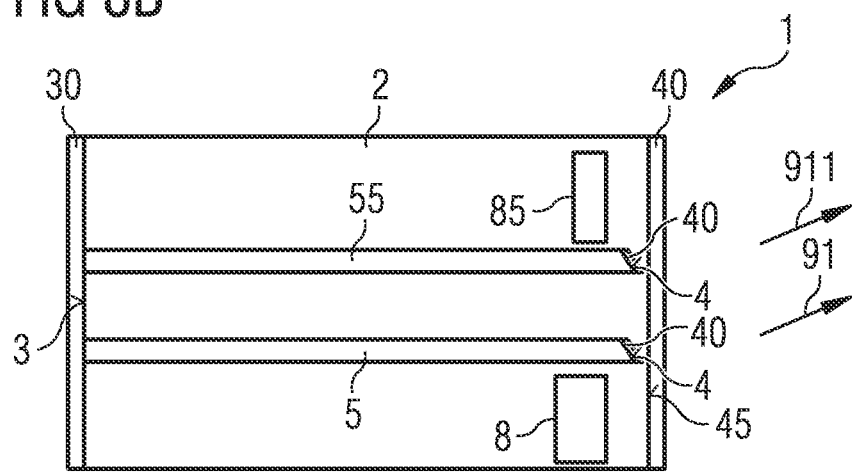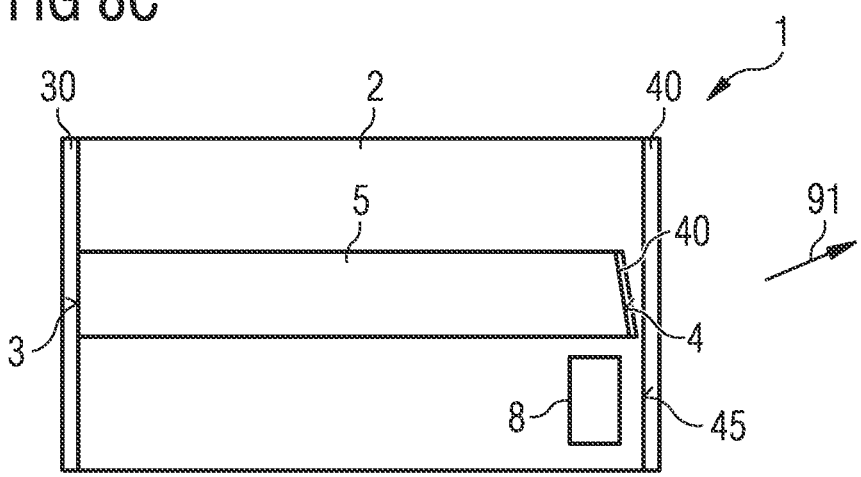

RADIATION-EMITTING SEMICONDUCTOR COMPONENT WITH A WAVEGUIDE MEETING A MIRROR SURFACE PERPENDICULARLY AND MEETING A COUPLING-OUT SURFACE OBLIQUELY

This patent application is a national phase filing under section 371 of PCT/EP2012/064894, filed Jul. 30, 2012, which claims the priority of German patent application 10 2011 111 604.8, filed Aug. 25, 2011, each of which is incorporated herein by reference in its entirety.

TECHNICAL FIELD

The present application relates to a radiation-emitting semiconductor component comprising a semiconductor body.

Laser sources, for example, semiconductor lasers with ridge waveguide geometry (ridge waveguide laser), can have a very narrowband emission spectrum. This can lead to a reduced imaging quality, for example, in projection applications on account of so-called speckle. This problem makes it more difficult in particular to realize large-area projection devices of high light intensity using laser diodes as radiation source.

SUMMARY OF THE INVENTION

Embodiments of the invention provide a semiconductor component with which the imaging quality can be improved and at the same time high optical output powers can be obtained.

In accordance with one embodiment, a radiation-emitting semiconductor component has a semiconductor body, which has a semiconductor layer sequence having an active region provided for generating radiation. The semiconductor component has a waveguide, which is provided for laterally guiding the radiation generated in the active region and which extends between a mirror surface and a coupling-out surface. The waveguide meets the mirror surface perpendicularly. The waveguide meets the coupling-out surface obliquely with respect to a normal to the coupling-out surface.

In this context, a lateral direction is understood to be a direction which runs perpendicularly to a normal to the semiconductor layers of the semiconductor layer sequence. The waveguide thus defines a radiation course in the main extension plane of the semiconductor layer sequence.

At the coupling-out surface, a main extension axis of the waveguide, or a tangent to the main extension axis in the case of a curved waveguide, thus does not run parallel, but rather obliquely with respect to the normal to the coupling-out surface.

In contrast to a semiconductor laser, therefore, the coupling-out surface is not perpendicular to the waveguide, with the result that the coupling-out surface does not form a resonator surface. In this way, a situation may be avoided in which, at the coupling-out surface, so much radiation is coupled back into the waveguide that stimulated emission in the active region leads to the emission of predominantly coherent radiation.

The semiconductor component is therefore provided for generating incoherent or at least only partly coherent radiation. The spectral width of the radiation emitted by the semiconductor component can thereby be increased relative to laser radiation. Preferably, the radiation emitted by the semiconductor component has a full width at half maximum (FWHM) of at least 2 nm. Preferably, the full width at half maximum is between 2 nm and 20 nm inclusive, particularly preferably 2 nm and 10 nm inclusive, for example, 5 nm. It has been found that a disturbing formation of a speckle pattern can be avoided in this way.

In a preferred configuration, the mirror surface is provided with a highly reflective coating, that is to say a coating which reflects at least 80%, preferably at least 90%, of the radiation generated in the active region. The higher the reflectivity of the mirror surface, the smaller the proportion of radiation which emerges from the semiconductor body on that side of the semiconductor component which is situated opposite the coupling-out surface.

The coupling-out surface is furthermore preferably provided with an antireflective layer. The coupling-out surface preferably has a reflectivity of at most 1%, preferably of at most 0.5%, for example, 0.1%.

The lower the reflectivity of the coupling-out surface, the lower the risk of radiation being reflected back from the coupling-out surface into the waveguide and of an undesired build-up of coherent laser modes taking place.

An angle between the waveguide and the normal to the exit surface is preferably at least 0.5°, particularly preferably at least 3°. In particular, the angle can be between 3° and 30° inclusive.

In a configuration variant, a deflection surface is formed in a beam path between the mirror surface and the coupling-out surface. By means of the deflection surface, the waveguide can be subdivided into partial regions whose main extension axes run obliquely or perpendicularly with respect to one another.

The deflection surface is preferably arranged relative to the mirror surface in such a way that the radiation reflected at the deflection surface in the direction of the coupling-out surface impinges on the coupling-out surface obliquely. In this configuration variant, the mirror surface and the coupling-out surface can run parallel to one another. During production, the mirror surface and the coupling-out surface can arise, for example, by means of splitting during singulation from a wafer assemblage.

In a preferred development, the radiation running along the waveguide impinges on the deflection surface at an angle which is greater than a critical angle of total reflection. In other words, the main extension axis of the waveguide forms an angle with a normal to the deflection surface, which angle has a magnitude such that the radiation is reflected at the deflection surface without any losses.

In a further preferred development, the deflection surface is formed in such a way that it has a higher reflectivity in a central region of the waveguide than in an edge region of the waveguide. What can be achieved in this way is that with regard to higher-order spatial modes, a higher proportion of which in comparison with the fundamental mode run in the edge region of the waveguide, a smaller proportion of said spatial modes are reflected. The deflection surface therefore acts as a spatial mode filter. A monomode emission is thus simplified.

In a further preferred configuration, the deflection surface is formed in a curved manner at least regionally. Preferably, the deflection surface is curved in such a way that the lateral extent of the radiation guided in the waveguide in the region of the coupling-out surface has a larger lateral extent than the radiation before impinging on the deflection surface. The radiation is therefore expanded toward the coupling-out surface, thereby reducing the loading of the facet and reducing the risk of mirror damage that leads to the failure of the component (Catastrophic Optical Mirror Damage, COMD).

In a further configuration variant, the waveguide has at least one partial region in which the waveguide runs in a curved manner. What can be achieved by means of the curvature is that the waveguide runs perpendicularly to the mirror surface and at an acute angle with respect to the normal to the coupling-out surface, without a deflection surface being required for this purpose. However, a waveguide having a curved partial region can additionally be formed with one or a plurality of deflection surfaces in the beam path.

The coupling-out surface can be formed by means of a side surface delimiting the semiconductor body in a lateral direction, in particular a side surface on the coupling-out side. The mirror surface and the side surface on the coupling-out side are preferably two mutually different side surfaces each delimiting the semiconductor body in a lateral direction. During production, the mirror surface and the coupling-out surface can arise during singulation of the semiconductor components from a wafer assemblage. Preferably the mirror surface and the coupling-out surface run parallel to one another.

Alternatively, the coupling-out surface can run obliquely with respect to the mirror surface. Furthermore, the coupling-out surface can be different than the side surface on the coupling-out side of the semiconductor component. During the production of the semiconductor component, the coupling-out surface is produced in this case by means of a chemical structuring step, in particular a dry-chemical etching method.

In a further preferred configuration, a structuring having at least one depression is formed on at least one side of the waveguide. The structuring is provided, in particular, for deliberately absorbing stray radiation or at least preventing said radiation from emerging on the part of the side surface on the coupling-out side of the semiconductor component.

Preferably, the at least one depression extends in a vertical direction at least through the active region. The depression can also extend through the entire semiconductor layer sequence.

The structuring can furthermore be designed in the form of at least one depression on both sides of the waveguide. A distance between the waveguide and the depression or depressions, that is to say a smallest distance between the waveguide and that depression of the structuring which is situated closest to the waveguide, is preferably at most 30 µm, particularly preferably at most 20 µm, most preferably at most 10 µm. By way of example, the distance can be between 0.1 µm and 3 µm.

In a direction running along the coupling-out surface, the extent of the depression or depressions is preferably between 0.1 µm and 500 µm, particularly preferably between 1 µm and 100 µm inclusive, most preferably between 3 µm and 50 µm inclusive.

In a direction running perpendicularly to the coupling-out surface, the extent of the depression or depressions is preferably between 0.1 µm and 50 µm inclusive, particularly preferably between 1 µm and 20 µm inclusive, most preferably between 1 µm and 10 µm inclusive.

In a preferred development, the at least one depression is at least partly filled with a material which absorbs the radiation generated in the active region.

In a preferred configuration, a radiation receiver having an active region provided for signal generation is integrated, in particular monolithically, into the semiconductor component. During the production of the semiconductor component, the active region of the radiation receiver and the active region of the semiconductor component provided for generating radiation can arise from the same semiconductor layers. The active regions can thus have the same material composition.

During the operation of the semiconductor component, the emitted radiation power can be monitored and, if appropriate, regulated by means of the radiation receiver.

In a configuration variant, the radiation receiver is arranged in such a way that part of the radiation propagating along the waveguide impinges directly on the radiation receiver.

In an alternative configuration variant, the radiation receiver is arranged in such a way that predominantly stray radiation impinges on the radiation receiver.

In the case of a waveguide having a curved partial region, the radiation receiver can be arranged, for example, in such a way that the waveguide runs in a curved manner away from the radiation receiver in the region of the radiation receiver. That is to say that, in the case of a waveguide curved left as viewed in the emission direction, the radiation receiver is preferably arranged on the right of the waveguide, and vice versa.

In the case of a semiconductor component having a deflection surface, the radiation receiver can be arranged in the region of the deflection surface. By way of example, the deflection surface can be partly transmissive to the radiation generated in the active region, such that part of the radiation passes through the deflection surface and impinges on the radiation receiver.

Generally, in particular a location of the semiconductor component at which a comparatively large amount of stray radiation occurs is suitable for the position of the radiation receiver. By way of example, the radiation receiver can also be arranged in the region of the coupling-out surface.

In a lateral direction, the waveguide can be formed as a ridge waveguide. A broad stripe waveguide can also be employed in order to increase the emitted radiation power. Alternatively or supplementarily, in order to increase the radiation power emitted overall, a plurality of waveguides, in particular waveguides with ridge waveguide or broad stripe waveguide geometry, can be arranged laterally alongside one another, in particular with main extension axes running parallel to one another at least regionally.

The semiconductor component described is distinguished by high achievable output powers with a directional spatial emission and an increased spectral width compared with a semiconductor laser. The semiconductor component is therefore suitable in particular for use as a radiation source in a projector. The risk of the imaging quality being impaired on account of speckle patterns can thus be reduced.

BRIEF DESCRIPTION OF THE DRAWINGS

Further features, configurations and expediencies will become apparent from the following description of the exemplary embodiments in conjunction with the figures.

FIGS. 1A to 1C show three exemplary embodiments of a semiconductor component in schematic plan view;

FIG. 1D shows a schematic sectional view of the exemplary embodiment shown in FIG. 1A along a line BB';

FIG. 1E shows a further exemplary embodiment of a semiconductor component in schematic sectional view;

FIGS. 2A and 2B show two further exemplary embodiments of a semiconductor component on the basis of a respectively enlarged illustration of an excerpt from the exemplary embodiment illustrated in FIG. 1A;

FIGS. 3A to 3E, 4A to 4D, 5A to 5C, 6A to 6D, 7A to 7C and 8A to 8C in each case illustrate a further exemplary embodiment of a semiconductor component in schematic plan view.

Figure 3D:
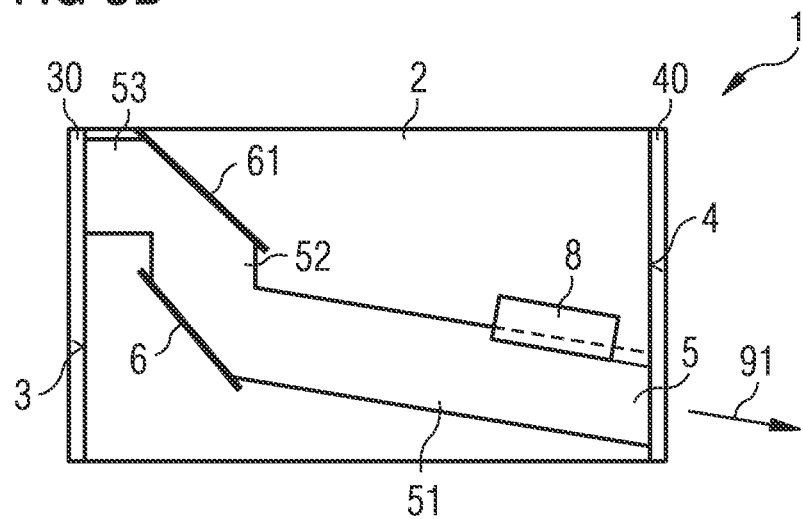

The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF ILLUSTRATIVE EMBODIMENTS

FIGS. 1A to 1C in each case illustrate an exemplary embodiment of a semiconductor component 1 in schematic plan view. The semiconductor component has a semiconductor body 2, in which a waveguide 5 is formed. The waveguide 5 is provided for guiding a radiation generated in an active region of the semiconductor body 2 in a lateral direction, that is to say in a direction running along a main extension plane of the semiconductor layer sequence of the semiconductor body.

An exemplary embodiment of a suitable layer sequence for the semiconductor body 2 is described in greater detail in connection with FIG. 9.

In a lateral direction, the semiconductor body 2 with the waveguide 5 extends between a mirror surface 3 and a coupling-out surface 4. In the exemplary embodiment shown, the mirror surface and the coupling-out surface are formed at opposite sides of the semiconductor body 2 and furthermore run parallel to one another.

The mirror surface 3 is provided with a highly reflective coating 30. The reflectivity of the coating is preferably at least 80%, particularly preferably at least 90%, for the radiation generated in the active region during operation.

The highly reflective coating 30 can be embodied as a Bragg mirror. Alternatively or supplementarily, a metallic mirror layer can be provided. In the case of a metallic mirror layer, an electrically insulating layer is preferably arranged between the semiconductor body and the metallic mirror layer, in particular in a manner directly adjoining the semiconductor body, in order to avoid an electrical short circuit.

The waveguide 5, in particular a main extension axis 50 of the waveguide, forms an angle 42 with a normal 41 to the coupling-out surface 4. That is to say that the waveguide 5 does not meet the coupling-out surface 4 perpendicularly. An angle between the waveguide and the coupling-out surface is preferably at least 0.5°, particularly preferably at least 3°. In particular, the angle can be between 0.5° and 30° inclusive, particularly preferably between 3° and 20° inclusive.

The coupling-out surface 4 is provided with an antireflective coating 40. The antireflective coating can be formed in one layer or with a plurality of partial layers. A thickness d of the antireflective coating or of at least one of the partial layers is preferably formed in such a way that it is formed as a λ/4 layer for a radiation generated with the wavelength λ in the active region at an angle α between the main extension axis of the waveguide and the normal to the coupling-out surface. That is to say that the following relationship holds true:

$$d=(\lambda/4n)*\cos(\alpha).$$

Here, n is the effective refractive index for radiation running in the waveguide 5.

A deflection surface 6 and a further deflection surface 61 are formed in the semiconductor body 2. The deflection surfaces are in each case arranged in a beam path along the waveguide 5 between the mirror surface 3 and the coupling-out surface 4. By means of the deflection surfaces, the waveguide is subdivided into a first partial region 51 between the coupling-out surface 4 and the deflection surface 6, a second partial region 52 between the deflection surface 6 and the further deflection surface 61, and a third partial region 53 between the further deflection surface 61 and the mirror surface 3.

In the third partial region 53, the waveguide 5 meets the mirror surface 3 perpendicularly. Radiation that is emitted in the active region and is emitted in the direction of the mirror surface can thus be efficiently reflected back into the waveguide 5.

The further deflection surface 61 is arranged at an angle of 45° with respect to the mirror surface 3, such that the second partial region 52 runs at an angle of 90° with respect to the third partial region 53.

The deflection surface 6 is arranged at an angle different than 45°, at an angle of less than 45° in the exemplary embodiment shown, with respect to the mirror surface 3, such that the radiation running along the first partial region 51 impinges on the coupling-out surface at an angle different than 0° with respect to the normal to said coupling-out surface. The radiation emerging from the semiconductor component is illustrated by an arrow 91.

The deflection surfaces 6, 61 can be formed by means of dry-chemical etching, for example. The angle of the deflection surfaces relative to the mirror surface 3 or the coupling-out surface 4 can thus be varied within wide limits.

What can be achieved by means of the described configuration of the waveguide 5 relative to the mirror surface 3 and the coupling-out surface 4 is that the radiation running in the waveguide brings about a stimulated emission. In comparison with a conventional light-emitting diode without a lateral waveguide, this brings about spatially a predominantly directional emission and spectrally a comparatively narrowband emission. In comparison with a laser, the coupling-out surface is formed, by means of the oblique arrangement with respect to the normal to the waveguide, in such a way that no optical feedback of the radiation into the waveguide 5 takes place. In other words, the semiconductor component 1 does not have a resonator. The generation of predominantly coherent radiation in the waveguide is thus avoided, in contrast to a laser.

In contrast to a laser, the described configuration of the waveguide leads to an incoherent emission with a larger spectral width. Preferably, the full width at half maximum is at least 2 nm, preferably between 4 nm and 20 nm inclusive.

The semiconductor component described is thus distinguished by a greatly directional emission with at the same time a comparatively wide spectral emission. The semiconductor component is therefore particularly suitable for the use as a radiation source in a projector. The risk of a reduced image quality on account of speckle can thus be avoided.

Two exemplary embodiments of the electrical contact-connection of the semiconductor component are shown schematically in FIGS. 1D and 1E. Here, FIG. 1D illustrates a sectional view along the line BB' shown in FIG. 1A. During the operation of the semiconductor component, by means of an electrical voltage being applied between a contact 24 and a further contact 25, charge carriers are injected from different sides into the active region 20 of the semiconductor body 2 and recombine there with emission of radiation.

In the case of the exemplary embodiment illustrated in FIG. 1D, the contact 24 and the further contact 25 are arranged on opposite sides of the semiconductor body 2. The contact 24 is electrically conductively connected to a top side of the waveguide 5 via a contact coating 240. The contact 24 need not necessarily be embodied as a separate layer formed on the contact coating 240, but rather can also be a partial region of the contact coating 240.

In order to avoid an electrical short circuit, an insulation layer 26 is arranged between the semiconductor body 2 and the contact coating 240.

The contact 24, the contact coating 240 and/or the further contact 25 preferably contain a metal or a metallic alloy. Furthermore, the elements mentioned can also be formed in a multilayered manner.

The semiconductor body 2 is arranged on a carrier 29. The carrier can be formed by a growth substrate for the semiconductor layer sequence of the semiconductor body 2. Alternatively, the carrier can also be different than the growth substrate. In this exemplary embodiment, the electrical contact-connection is effected through the carrier. The carrier is expediently electrically conductive. Alternatively, the semiconductor body can also be formed in a manner free of a carrier. The further contact 25 can directly adjoin the semiconductor body 2 in this case.

In contrast thereto, the contacts 24, 25 are arranged on the same side of the semiconductor body 2 in the case of the exemplary embodiment illustrated in FIG. 1E. The contact 24 makes contact with the semiconductor body on the top side of the waveguide 5. The further contact 25 adjoins the semiconductor body 2 laterally with respect to the waveguide. In this case, therefore, the electrical contact-connection can be effected independently of the carrier 29, such that the latter can also have a comparatively low electrical conductivity or be formed in an electrically insulating manner.

These exemplary embodiments of the electrical contact-connection are also suitable for the exemplary embodiments of the semiconductor component 1 which are described below. To simplify the illustration, the contact 24 and the further contact 25 are not shown explicitly in the subsequent figures.

It goes without saying that, in a departure from the exemplary embodiment described, only one deflection surface or more than two deflection surfaces may be provided. By way of example, the mirror surface 3 and the coupling-out surface 4 can be formed as two mutually adjoining side surfaces of the semiconductor component 1, wherein only one deflection surface is arranged in the beam path between these surfaces.

In the case of the exemplary embodiment illustrated in FIG. 1A, the waveguide 5 is formed as a ridge waveguide. The width of the waveguide in a lateral direction is preferably less than the so-called "cut-off" width, such that the waveguide brings about substantially monomode radiation propagation in a lateral direction. In contrast thereto, the waveguide 5 is formed as a broad stripe waveguide in the case of the exemplary embodiment illustrated in FIG. 1B. The output power of the radiation-emitting semiconductor component can thus be increased.

For increasing the radiation power even more extensively, it is also possible for a plurality of waveguides to be arranged in a lateral direction. In FIG. 1C, an exemplary embodiment is formed by way of example with a waveguide 5 and a further waveguide 55. Analogously to the waveguide 5, a deflection surface 6 and a further deflection surface 61 are formed in the beam path of the further waveguide 55, such that the waveguide 55 is subdivided into a first partial region 551, a second partial region 552 and a third partial region 553. The first, second and third partial regions of the waveguides 5, 55 in each case run parallel to one another.

A radiation emerging from the further waveguide 55 runs parallel to the radiation emerging from the waveguide 5 (illustrated by an arrow 911).

The distance between the waveguides 5, 55 is preferably formed with a magnitude at least such that the heat loss can still be efficiently dissipated from the semiconductor component 1. Furthermore, a coupling of the modes guided in the waveguides can occur in the case of a comparatively small distance between the waveguides 5, 55.

It goes without saying that it is also possible for more than two waveguides to be arranged alongside one another in a lateral direction. The waveguides 5, 55 arranged laterally alongside one another can be formed in particular as ridge waveguides as described in FIG. 1A or as broad stripe waveguides as described in FIG. 1B.

FIGS. 2A and 2B show two exemplary embodiments of a configuration of a deflection surface on the basis of an enlarged illustration of an excerpt A illustrated in FIG. 1A. The description is given merely by way of example for the configuration of the further deflection surface 61 of the exemplary embodiment illustrated in FIG. 1A and can also be applied to the configuration of the deflection surface 6 or of the further deflection surface 6 in the exemplary embodiments described above and below.

The further deflection surface 61 is formed as an etched surface of the semiconductor body 2. The further deflection surface 61 is formed in such a way that it has a higher reflectivity in a central region 611 than in an edge region 612. Higher-order spatial modes thus experience greater losses of reflection at the further deflection surface 61 than the fundamental mode of the waveguide 5. A monomode emission of the semiconductor component 1 can thus be fostered. The deflection surface therefore acts as a spatial mode filter, such that a monomode or at least substantially monomode emission can also be obtained with a comparatively wide waveguide.

In the exemplary embodiment illustrated in FIG. 2A, the higher reflection in the central region is achieved by virtue of the fact that only the central region 611 of the further deflection surface 61 is provided with a mirror layer 7. The mirror layer 7 can be formed as a metal layer or as a dielectric multilayer structure. A combination of a dielectric multilayer structure with a metal layer can also be employed.

In contrast thereto, in the case of the exemplary embodiment illustrated in FIG. 2B, the edge regions 612 are provided with an absorbent region 71. The absorbent region is provided for deliberately absorbing the radiation that is generated in the active region and runs in the edge region of the waveguide 5. In this configuration, the mirror layer 7 can either be formed only in the central region 611 or, as illustrated in FIG. 2B, be arranged in such a way that the absorbent region 71 is arranged in the edge region 612 between the mirror layer and the further deflection surface 61.

The configuration described therefore brings about a spatial mode filter. A monomode emission can thus be obtained even in the case of a waveguide whose width is greater than the cut-off width for a ridge waveguide.

In a departure from the exemplary embodiments described, different degrees of reflectivity for the central region 611 and the edge region 612 can also be formed by etching processes extending into the semiconductor body to different depths.

Furthermore, in a departure from the exemplary embodiments described with reference to FIGS. 2A and 2B, a mirror layer can also be dispensed with. This is the case, in particular, if the radiation impinges on the deflection surface at an angle which is greater than the angle for total reflection. By way of example, in the case of a semiconductor body based on gallium nitride, at an interface with air the critical angle is 23.6°.

A further exemplary embodiment, illustrated in FIG. 3A, substantially corresponds to the exemplary embodiment described in connection with FIG. 1A. In contrast thereto, the semiconductor component 1 additionally has a radiation receiver 8. The radiation receiver 8 is integrated into the semiconductor component 1 and is provided for monitoring the radiation power emitted by the semiconductor component 1. A radiation receiver which is embodied separately from the semiconductor component and has to be adjusted relative thereto can therefore be dispensed with. Preferably, an active region of the radiation receiver provided for signal generation and the active region of the semiconductor component provided for generating radiation arise from the same semiconductor layer sequence.

In the case of the exemplary embodiment illustrated in FIG. 3A, the radiation receiver 8 is arranged in the region of the deflection surface 6. Radiation which runs in the second partial region 52 of the waveguide and does not impinge on the deflection surface 6 can be detected by the radiation receiver and thus provide information about the emitted radiation power. Such a radiation receiver 8 can, of course, also be employed in the other exemplary embodiments described. By way of example, FIG. 3B describes an exemplary embodiment of a semiconductor component which is embodied substantially as described in FIG. 1B and has a radiation receiver 8. In contrast to the exemplary embodiment described in FIG. 3A, the radiation receiver is arranged in the region of the coupling-out surface 4 and can detect radiation reflected at the coupling-out surface, in particular.

A further exemplary embodiment of a semiconductor component is illustrated in FIG. 3C. This further exemplary embodiment substantially corresponds to the exemplary embodiment described in connection with FIG. 3A. In contrast thereto, the deflection surface 6 is formed as a curved deflection surface. By means of the curved deflection surface, the radiation propagating in the waveguide 5 in the direction of the exit surface 4 can be expanded in the first partial region 51 of the waveguide. The radiation thus impinges on the coupling-out surface 4 on a larger cross-sectional area, such that the risk of damage to the coupling-out surface is reduced.

Furthermore, the curved deflection surface 6 can be formed in such a way that, in comparison with a planar deflection surface, a larger proportion of radiation impinges on the radiation receiver 8.

The further exemplary embodiment of a semiconductor component illustrated in FIG. 3D substantially corresponds to the exemplary embodiment illustrated in FIG. 3B. In contrast thereto, the radiation receiver 8 is arranged in an edge region of the waveguide 5, such that part of the radiation running along the waveguide impinges directly on the radiation receiver.

Figure 3E:
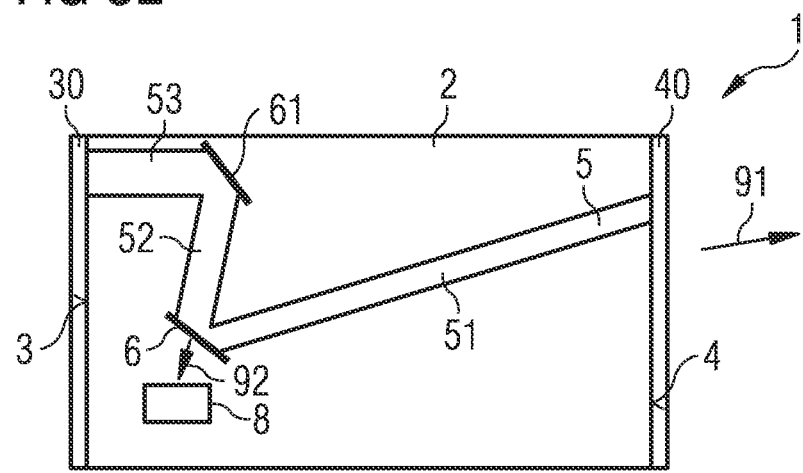

The further exemplary embodiment illustrated in FIG. 3E substantially corresponds to the exemplary embodiment described in connection with FIG. 3A. In contrast thereto, the deflection surface 6 is formed as partly transmissive in a targeted manner. This can be achieved, for example, by virtue of the fact that a normal to the deflection surface 6 forms an angle with that partial region of the waveguide which meets the deflection surface, which angle is less than the angle for total reflection, with the result that part of the radiation impinging on the deflection surface 6 is transmitted. This transmitted proportion of the radiation is illustrated by an arrow 92 in FIG. 3E.

FIG. 4A illustrates a further exemplary embodiment of a radiation-emitting semiconductor component 1 in schematic plan view. In contrast to the exemplary embodiment illustrated in FIG. 1A, the waveguide 5 is formed in a curved manner regionally in such a way that the waveguide 5 meets the mirror surface 3 perpendicularly and the coupling-out surface 4 obliquely with respect to a normal to the coupling-out surface 4. Deflection surfaces in the beam path of the waveguide are therefore not necessary, but can additionally be provided, for example, in order to increase the optical path within the semiconductor component.

In the case of a waveguide 5 having a curved partial region, higher losses occur in comparison with a rectilinear waveguide. Higher-order spatial modes are affected by this to a greater extent than the fundamental mode, such that a monomode emission, particularly in the case of comparatively wide waveguides, is fostered. The radiation power can thus be increased in a simplified manner whilst maintaining a monomode emission.

Furthermore, the semiconductor component 1 has a radiation receiver 8, which can be embodied in particular as described in connection with FIG. 3A. In this exemplary embodiment, the radiation receiver 8 is arranged in such a way that radiation reflected at the coupling-out surface 4, illustrated by an arrow 93, impinges on the radiation receiver 8.

Furthermore, the semiconductor component 1 has a structuring 85. The structuring 85 can be formed by one or a plurality of depressions in the semiconductor body. The structuring is provided for deliberately absorbing stray radiation emerging from the waveguide 5. Radiation that does not follow the curved course of the waveguide 5 can thus be efficiently prevented from emerging through the coupling-out surface 4.

Preferably, the depression of the structuring 85 is at least partly filled with a material which deliberately absorbs the radiation generated in the active region.

A distance between the waveguide 5 and the structuring 85 is preferably at most 20 µm, preferably at most 10 µm. Particularly preferably, the distance is between 0 µm and 3 µm inclusive. The structuring can therefore directly adjoin the waveguide.

In a vertical direction, that is to say in a direction running parallel to a normal to the main extension plane of the semiconductor layer sequence of the semiconductor body, the at least one depression of the structuring 85 preferably extends at least through the active region. In particular, the structuring can penetrate through the entire semiconductor layer sequence of the semiconductor body 2.

In a direction running parallel to the coupling-out surface, the extent of the structuring is preferably between 0.1 µm and 500 µm inclusive, preferably between 1 µm and 100 µm, particularly preferably between 3 µm and 50 µm.

In a direction running perpendicularly thereto, the extent is preferably between 0.1 µm and 50 µm, preferably between 1 µm and 20 µm inclusive, particularly preferably between 1 µm and 10 µm inclusive.

At least one of the depressions of the structuring 85 is furthermore preferably embodied in such a way that its main extension direction forms an angle different than 0° with respect to the waveguide. The suppression of stray light can thus be achieved in an improved manner.

The depression of the structuring 85 furthermore preferably has a rough side surface, such that a directional backreflection of stray radiation can be avoided.

The structuring 85 described can also be applied to a semiconductor component in which the waveguide is not curved, for example, in the exemplary embodiments described in connection with FIGS. 1A to 3E and 7A to 8C.

The further exemplary embodiment illustrated in FIG. 4B substantially corresponds to the exemplary embodiment described in connection with FIG. 4A. In contrast thereto, the structuring 85 is arranged on both sides of the waveguide 5. As illustrated in FIG. 4C, the structuring can also have in each case more than one depression on both sides of the waveguide. Preferably, the depressions of the structuring in each case have a main extension direction which runs obliquely or perpendicularly with respect to the waveguide 5 in the region of the respective depression.

The further exemplary embodiment illustrated in FIG. 4D substantially corresponds to the exemplary embodiment described in connection with FIG. 4A. In contrast thereto, the radiation receiver 8 is arranged in such a way that the waveguide runs in a curved manner away from the radiation receiver in the region of the radiation receiver 8. What can thus be achieved is that part of the radiation which runs in the direction of the coupling-out surface and does not follow the waveguide 5 (illustrated by an arrow 94) impinges on the radiation receiver.

Figure 5A:
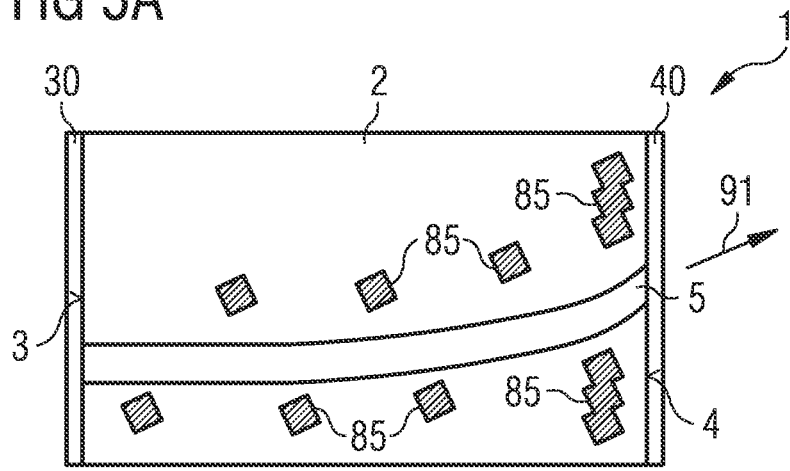
Figure 5B:
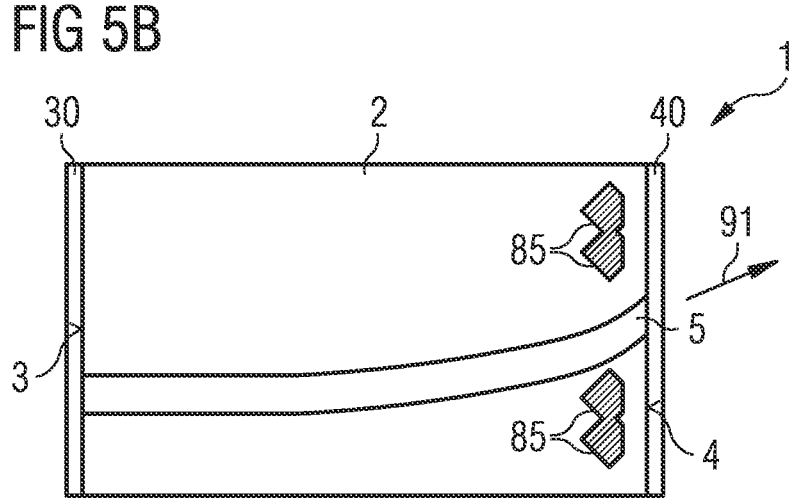

The exemplary embodiments illustrated in FIGS. 5A and 5B substantially correspond to the exemplary embodiment described in connection with FIG. 4B. The structuring 85 is formed in each case by a plurality of depressions, wherein the depressions in the case of the exemplary embodiment illustrated in FIG. 5A run firstly along the coupling-out surface 4 and secondly along the waveguide 5.

By means of the depressions of the structuring 85 that are arranged along the coupling-out surface 4, the coupling-out of radiation on the part of the coupling-out surface 4 outside the waveguide 5 is reduced. The depressions of the structuring 85 that are additionally formed along the waveguide can, as illustrated in FIG. 5B, also be dispensed with.

The structuring 85 serves, in particular, for efficiently scattering and/or absorbing higher-order spatial modes, such that the structuring in combination with a curved waveguide acts as a spatial mode filter. Higher output power can thus be obtained whilst maintaining the monomode emission characteristic.

The structuring 85 can be obtained, for example, by means of dry-chemical etching, by means of a focused ion beam (FIB), by means of a laser method, for instance by means of a laser cut method, or by means of a stealth dicing method.

The stray light deflected at the structuring 85 can be used for the monitoring of the emitted radiation power by means of the integrated radiation receiver 8.

Figure 5C:
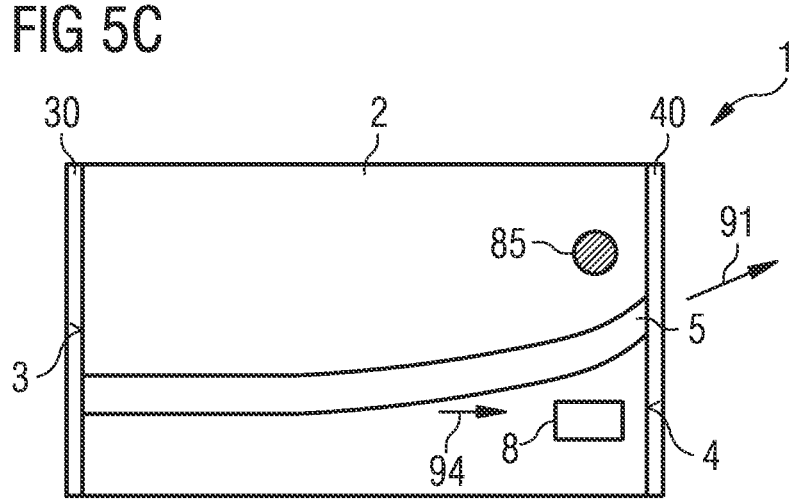

The exemplary embodiment illustrated in FIG. 5C substantially corresponds to the exemplary embodiment illustrated in connection with FIG. 4B. In contrast thereto, the structuring has a depression having a circular boundary as an example of an at least regionally curved, in particular elliptic, boundary.

The form of the individual depressions and also the density of the depressions of the structuring 85 can be varied within wide limits. It goes without saying that the depressions of the structuring 85 can also differ from one another at least partly with regard to the basic form or the cross section.

In the case of the exemplary embodiments illustrated in FIGS. 6A to 6B, the waveguide 5 is formed in a curved manner regionally as described in connection with FIG. 4A. In addition, the semiconductor component 1 has a further waveguide 55, such that the radiation power emitted overall, illustrated by the arrows 91, 911, can be increased.

As illustrated in FIG. 6B, a radiation receiver 8 can be integrated into the semiconductor component, which radiation receiver can be embodied in particular as described in connection with FIG. 3A.

As described in connection with FIGS. 1B and 1C, in order to increase the radiation power, the waveguide can also be formed as a curved broad stripe waveguide (FIG. 6C). It goes without saying that, as illustrated in FIG. 6D, a plurality of broad stripe waveguides may be formed in a semiconductor component in order to increase the emitted radiation power even more extensively.

FIG. 7A schematically illustrates a further exemplary embodiment of a semiconductor component 1 in plan view.

In contrast to the exemplary embodiment illustrated in FIG. 1A, the coupling-out surface 4 delimiting the waveguide 5 differs from a side surface 45 on the coupling-out side delimiting the semiconductor body 2.

An angle between the waveguide and the normal to the coupling-out surface 4 is achieved by virtue of the fact that the coupling-out surface 4 is arranged obliquely with respect to the side surface 45 on the coupling-out side and obliquely with respect to the mirror surface 3. The coupling-out surface can be formed, for example, by means of an etching method, as described in connection with the deflection surfaces 6, 61.

As described in connection with FIG. 1A, the coupling-out surface 4 and furthermore also the side surface 45 on the coupling-out side are provided with an antireflective coating.

The waveguide 5 illustrated in this exemplary embodiment therefore constitutes a rectilinear waveguide that is formed in a manner free of deflection surfaces in its beam path. In a departure from this, however, the waveguide can have at least one deflection surface as described in connection with FIG. 1A and/or a curved partial region as described in connection with FIG. 4A.

As illustrated in FIGS. 7B and 7C, a radiation receiver 8 can be formed in the exemplary embodiment explained in connection with FIG. 7A, which radiation receiver can be formed in particular as described in connection with FIG. 3A.

Furthermore, as illustrated in FIG. 7B, a structuring 85 can be provided, which can be embodied as described in connection with FIG. 4B.

The further exemplary embodiments illustrated in FIGS. 8A and 8B correspond to the exemplary embodiments described in connection with FIGS. 7A and 7B, wherein, in contrast thereto, a further waveguide 55 is formed in each case in addition to the waveguide 5 in order to increase the radiation power that emerges, said further waveguide running parallel to the waveguide 5.

Alternatively or supplementarily, as illustrated in FIG. 8C, the waveguide 5 can also be formed as a broad stripe waveguide in order to increase the radiation power.

Figure 9:
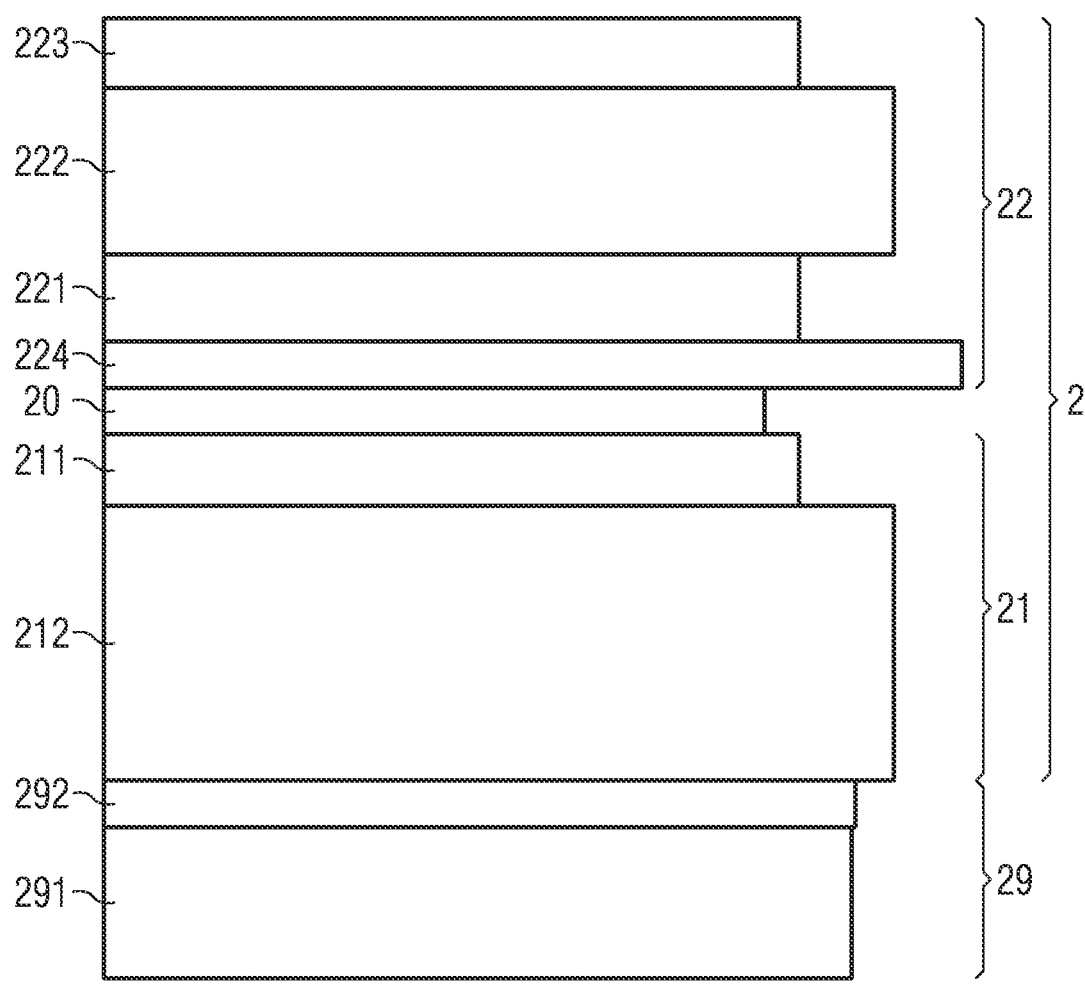
FIG. 9 shows an exemplary embodiment of a layer construction of a semiconductor component in schematic illustration. Elements that are identical, of identical type or act identically are provided with the same reference signs in the figures.

An exemplary embodiment of a layer construction of the semiconductor body is illustrated schematically in FIG. 9. This layer construction is suitable for all the exemplary embodiments described above.

The semiconductor layer sequence forming the semiconductor body 2 is based on a nitride compound semiconductor material. In the present context, "based on nitride compound semiconductors" means that the active epitaxial layer sequence or at least one layer thereof comprises a nitride III/V compound semiconductor material, preferably $Al_nGa_mIn_{1-n-m}N$, wherein $0 \leq n \leq 1$, $0 \leq m \leq 1$ and $n+m \leq 1$. In this case, this material need not necessarily have a mathematically exact composition according to the above formula. Rather, it can comprise one or more dopants and additional constituents which substantially do not change the characteristic physical properties of the $Al_nGa_mIn_{1-n-m}N$ material. For the sake of simplicity, however, the above formula only includes the essential constituents of the crystal lattice (Al, Ga, In, N), even if these can be replaced in part by small amounts of further substances.

The semiconductor layer sequence is arranged on a carrier 29. The carrier 29 is preferably the substrate on which the semiconductor layer sequence is deposited. In particular, a substrate containing at least one gallium nitride layer is suitable as the growth substrate. In a departure from this, however, the semiconductor layer sequence of the semiconductor body 2 can also be deposited epitaxially on some other growth substrate, for example, sapphire, silicon or a composite substrate. Furthermore, the carrier 29 can also differ from a growth substrate and be fixed to the semiconductor layer sequence after the epitaxial deposition.

In the exemplary embodiment described, the carrier 29 has a first partial region 291 and a second partial region 292, which faces the semiconductor layer sequence. In this exemplary embodiment, the second partial region is n-conductively doped, for example, with silicon.

In the schematic illustration in FIG. 9, the lateral extent of the elements illustrated represents the band gap of the semiconductor material. The larger the lateral extent in the figure, the larger the band gap of the respective material. The semiconductor layer sequence 2 has an active region 20 provided for generating radiation, said active region being arranged between an n-conducting region 21, for example, doped with silicon, and a p-conducting region 22, for example, doped with magnesium. The n-conducting region 21 has a waveguide layer 211 adjoining the active region 20, and a cladding layer 212.

The p-conducting region 22 correspondingly has a waveguide layer 221 and a cladding layer 222. An electron barrier 224 is formed between the waveguide layer 221 and the active region 20. The band gap of the electron barrier is larger than the band gap of the active region, such that electrons injected into the active region via the n-conducting region are blocked by the electron barrier 224.

Furthermore, the p-conducting region comprises a contact layer 223, which is provided for the simplified formation of an ohmic contact with the contact 24 (not explicitly illustrated in FIG. 9).

The cladding layers 212, 222 in each case have a larger Al content than the waveguide layers 211, 221, such that the cladding layers have a lower refractive index than the waveguide layers and thus cause the radiation generated in the active region to be guided in a vertical direction.

During the formation of deflection surfaces, the etching is preferably effected to a depth such that it reaches at least the cladding layer situated closest to the carrier. Preferably, the etching reaches right into the carrier 29.

For the formation of a radiation receiver, the active region of the radiation receiver and the active region provided for generating radiation can arise from the same layer.

It goes without saying that the exemplary embodiments of the semiconductor component described in connection with FIGS. 1A to 8C are also suitable for semiconductor bodies which are based on a different compound semiconductor material, for example, a phosphide or arsenide compound semiconductor material.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. A radiation-emitting semiconductor component comprising:
    a semiconductor body, which has a semiconductor layer sequence having an active region configured to generate radiation; and
    a waveguide provided for laterally guiding the radiation generated in the active region and extends between a mirror surface and a coupling-out surface;
    wherein the waveguide meets the mirror surface perpendicularly; and
    wherein the waveguide meets the coupling-out surface obliquely with respect to a normal to the coupling-out surface.

2. The radiation-emitting semiconductor component according to claim 1, wherein the mirror surface is provided with a highly reflective coating and the coupling-out surface is provided with an antireflective coating.

3. The radiation-emitting semiconductor component according to claim 1, wherein a structuring having a depression is formed at least on one side of the waveguide, wherein the depression extends through the active region and the structuring is at a distance of at most 30 µm from the waveguide.

4. The radiation-emitting semiconductor component according to claim 3, wherein the depression is at least partly filled with a material that absorbs the radiation generated in the active region.

5. The radiation-emitting semiconductor component according to claim 1, wherein a deflection surface is formed in a beam path between the mirror surface and the coupling-out surface.

6. The radiation-emitting semiconductor component according to claim 5, wherein the deflection surface is arranged at an angle different than 45° with respect to the mirror surface, such that the radiation impinges on the coupling-out surface at an angle different than 0° with respect to the normal to the coupling-out surface.

7. The radiation-emitting semiconductor component according to claim 5, wherein the deflection surface is formed in such a way that it has a higher reflectivity in a central region of the waveguide than in an edge region.

8. The radiation-emitting semiconductor component according to claim 5, wherein the deflection surface is formed in a curved manner at least regionally.

9. The radiation-emitting semiconductor component according to claim 1, wherein the waveguide has a partial region in which the waveguide runs in a curved manner.

10. The radiation-emitting semiconductor component according to claim 1, wherein the coupling-out surface is formed by a side surface delimiting the semiconductor body in a lateral direction.

11. The radiation-emitting semiconductor component according to claim 1, wherein the coupling-out surface runs obliquely with respect to the minor surface.

12. The radiation-emitting semiconductor component according to claim 1, further comprising a radiation receiver having an active region provided for signal generation, the radiation receiver integrated into the semiconductor component.

13. The radiation-emitting semiconductor component according to claim 12, wherein a deflection surface is formed in a beam path between the mirror surface and the coupling-out surface and wherein the radiation receiver is arranged in the region of the deflection surface.

14. The radiation-emitting semiconductor component according to claim 12, wherein the waveguide has at least one partial region in which the waveguide runs in a curved manner and the radiation receiver is arranged in such a way that the waveguide runs in a curved manner away from the radiation receiver in the region of the radiation receiver.

15. The radiation-emitting semiconductor component according to claim 1, wherein the radiation emitted by the semiconductor component has a full width at half maximum of at least 2 nm.

16. The radiation-emitting semiconductor component according to claim 13, wherein the waveguide has at least one partial region in which the waveguide runs in a curved manner and the radiation receiver is arranged in such a way that the waveguide runs in a curved manner away from the radiation receiver in the region of the radiation receiver.

17. A radiation-emitting semiconductor component comprising:
- a semiconductor body, which has a semiconductor layer sequence having an active region configured to generate radiation; and
- a waveguide provided for laterally guiding the radiation generated in the active region, the waveguide extends between a mirror surface and a coupling-out surface;
- wherein the waveguide meets the mirror surface perpendicularly; and
- wherein a deflection surface is formed in a beam path between the minor surface and the coupling-out surface, the deflection surface being arranged at an angle different than 45° with respect to the mirror surface, such that the radiation impinges on the coupling-out surface at an angle different than 0° with respect to the normal to said coupling-out surface.

18. A radiation-emitting semiconductor component comprising:
- a semiconductor body, which has a semiconductor layer sequence having an active region provided for generating radiation; and
- a waveguide provided for laterally guiding the radiation generated in the active region, the waveguide extending between a minor surface and a coupling-out surface;
- wherein the waveguide meets the mirror surface perpendicularly;
- wherein the waveguide meets the coupling-out surface obliquely with respect to a normal to the coupling-out surface;
- wherein the waveguide has at least one partial region in which the waveguide runs in a curved manner; and
- wherein a structuring having at least one depression is formed at least on one side of said partial region of the waveguide, wherein the depression extends through the active region and the structuring is at a distance of at most 30 µm from the waveguide.

* * * * *